United States Patent [19]
Lee et al.

[11] Patent Number: 5,834,342
[45] Date of Patent: Nov. 10, 1998

[54] SELF-ALIGNED SILICIDATION OF TFT SOURCE-DRAIN REGION

[75] Inventors: Kan-Yuan Lee, Hou-Pi; Shou-Gwo Wuu, Chu-Tong; Dun-Nian Yang, Taipei, all of Taiwan

[73] Assignee: Taiwan Semiconductor Manufacturing Company, Ltd., Hsin-Chu, Taiwan

[21] Appl. No.: 884,917

[22] Filed: Jun. 30, 1997

[51] Int. Cl.$^6$ .................................................. H01L 21/265
[52] U.S. Cl. .......................... 438/153; 438/158; 438/159; 438/160
[58] Field of Search .................................. 438/158, 159, 438/160, 153, 154

[56] References Cited

U.S. PATENT DOCUMENTS

| | | | |
|---|---|---|---|
| 5,403,759 | 4/1995 | Havemann | 438/152 |
| 5,495,119 | 2/1996 | Ikeuchi | 257/365 |
| 5,496,752 | 3/1996 | Nasu et al. | 438/30 |
| 5,576,556 | 11/1996 | Takemura et al. | 257/69 |
| 5,612,235 | 3/1997 | Wu et al. | 438/158 |
| 5,696,011 | 12/1997 | Yamazaki et al. | 438/166 |
| 5,728,604 | 3/1998 | Rha et al. | 438/163 |
| 5,736,436 | 4/1998 | Matsumoto et al. | 438/157 |

*Primary Examiner*—Peter Toby Brown
*Assistant Examiner*—Edwin Oh
*Attorney, Agent, or Firm*—George O. Saile; Stephen B. Ackerman

[57] ABSTRACT

A process for manufacturing a thin film transistor for use in a CMOS SRAM circuit is described. A key feature is the formation of two different photoresist masks from the same optical mask. The first photoresist mask is generated using a normal amount of actinic radiation during exposure and is used to protect the gate region during source and drain formation through ion implantation. The second photoresist mask is aligned relative to the gate in exactly the same orientation as the first mask but is given a reduced exposure of actinic radiation. This results, after development, in a slightly larger mask which is used during etching to form the oxide cap that will protect the channel area during the subsequent silicidation step. Making the cap slightly wider than the channel ensures that small lengths of the source and the drain regions that abut the channel are not converted to silicide. Thus, the finished device continues to act as a thin film transistor, but has greatly reduced source and drain resistances.

12 Claims, 3 Drawing Sheets

SELF-ALIGNED SILICIDATION OF TFT SOURCE-DRAIN REGION

BACKGROUND OF THE INVENTION

(1) Field of the Invention

The invention relates to the general field of thin film transistors, more particularly as used in CMOS SRAM circuits.

(2) Description of the Prior Art

In response to the ever present demand for denser memory cells, Complementary Metal Oxide Semiconductor (CMOS) Static Random Access Memories (SRAMs) that use a minimum of conventional Field Effect Transistors (FETs) have been developed. Instead of implementing the basic memory cell entirely within the original single crystal silicon, thin film transistors (TFTs) based on deposited amorphous or poly silicon are also used. The advantage of using the TFTs lies in the fact that they can be stacked directly on top of the single crystal devices.

In FIG. 1 we show a schematic diagram for a typical CMOS SRAM memory cell. Two polysilicon load resistors are also part of the basic cell but are not shown here in the interests of improved clarity. The two lower devices 1 are N-channel FETs implemented in single crystal silicon while the two upper devices 2 are P-channel devices implemented as thin film transistors.

The CMOS process necessitates that the source/drain (S/D) connectors to these devices be fabricated from P+ polysilicon for the TFTs and from N+ polysilicon for the FETS. This results in the formation of P–N junctions 3 at the point where the two different silicon types meet and connect.

In FIG. 2, a schematic is shown of one of the TFTs seen in the circuit of FIG. 1. Gate 21 controls current flow between source 23 and drain 22. Associated with the source is source series resistance 25 which is due to the P+ poly, while associated with drain 22 is drain series resistance 24 which is also due to the P+ poly. Additionally, P–N junction 26 (seen as 3 in FIG. 1) is also in series with the drain, introducing still more resistance (as well as capacitance) into the circuit.

The present invention describes a method for greatly reducing the magnitudes of series resistances 24 and 25 while at the same time short circuiting P–N junction 26.

SUMMARY OF THE INVENTION

It has been an object of the present invention to provide a process for manufacturing thin film transistors having reduced source and drain resistances.

Another object of the present invention has been to provide a CMOS SRAM circuit wherein unwanted P–N junctions, introduced as a byproduct of the CMOS methodology, are eliminated.

Still another object of the present invention has been to provide a process for manufacturing thin film transistors wherein the same optical mask is used to define photoresist masks for both ion implant and oxide cap formation.

These objects have been achieved by forming two different photoresist masks from the same optical mask. The first photoresist mask is generated using a normal amount of actinic radiation during exposure and is used to protect the gate region during source and drain formation through ion implant. The second photoresist mask is aligned relative to the gate in exactly the same orientation as the first mask but is given a reduced exposure of actinic radiation. This results, after development, in a slightly larger mask which is used to control formation of the oxide cap that will cover the channel area during the subsequent silicidation step. Making the cap slightly wider than the channel ensures that small lengths of the source and the drain regions that abut the channel are not converted to silicide. Thus, the device continues to act as a thin film transistor, but has greatly reduced source and drain resistances.

DESCRIPTION OF THE PREFERRED EMBODIMENTS

Figure 1:
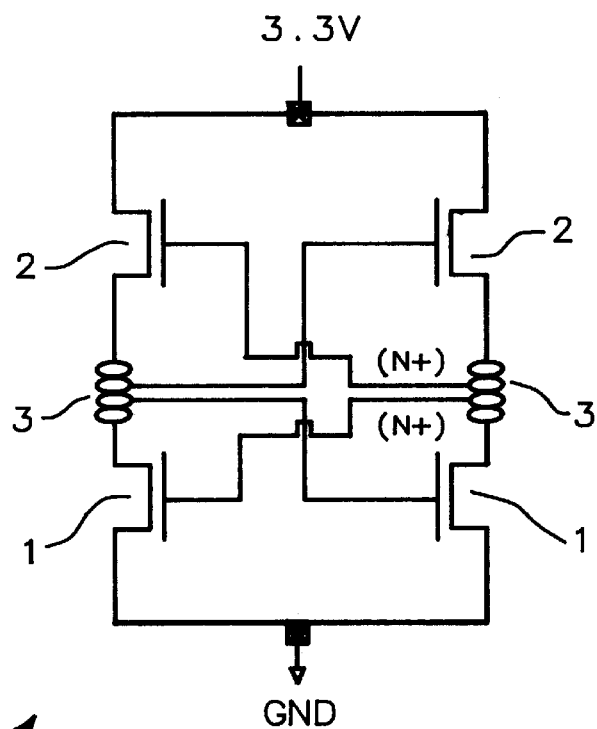
FIG. 1 is a schematic diagram of a CMOS SRAM circuit that includes two FETs and two TFTs.
Figure 2:
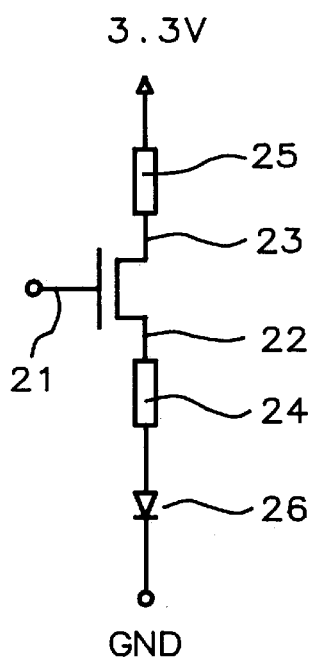
FIG. 2 is a more detailed view of the drain portion of the circuit seen in FIG. 1.
Figure 3:
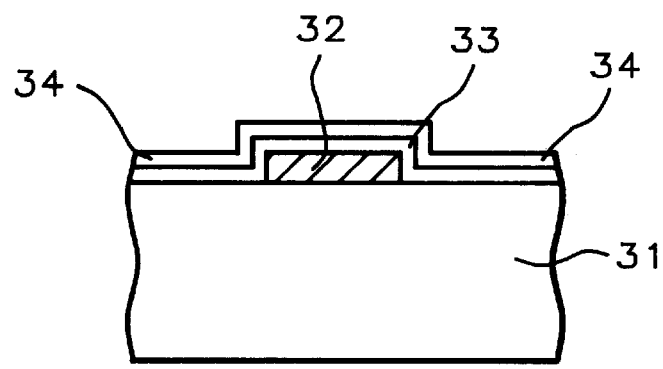
FIGS. 3 through 7 show successive steps in the process of the present invention which results in a circuit having reduced source and drain resistances.

Referring to FIG. 3, the process of the present invention begins with the provision of a dielectric substrate. This could be a substrate that comprises dielectric and nothing else but, when the process is used as part of the manufacture of a CMOS SRAM circuit, this substrate, designated as 31 in the figure, will be a layer of dielectric on a silicon substrate in which FETs have already been formed as part of CMOS methodology. Typically, this dielectric layer will be silicon oxide and will be between about 2,000 and 5,000 Angstroms thick.

A layer of polysilicon is deposited onto substrate 31 and is patterned and etched to form poly gate 32 which is typically rectangular in shape, being about 0.8 microns long by about 0.55 microns wide by about 550 Angstroms thick (although any thickness in the range from about 500 to 1,250 Angstroms would still be acceptable).

Next, gate oxide layer 33 is deposited to cover both poly gate 32 and substrate 31. Layer 33 is generally about 300 Angstroms thick (although any thickness in the range from about 200 to 500 Angstroms would still be acceptable). This is followed by the deposition of amorphous silicon layer 34, generally to a thickness of about 300 Angstroms, but any thickness in the range from about 100 to 1,000 Angstroms would still be acceptable. The amorphous silicon is deposited by Low Pressure Chemical Vapor Deposition, following which it is recrystallized by heating in nitrogen for 22 to 26 hours at a temperature between about 550 and 650 ° C.

Figure 4:
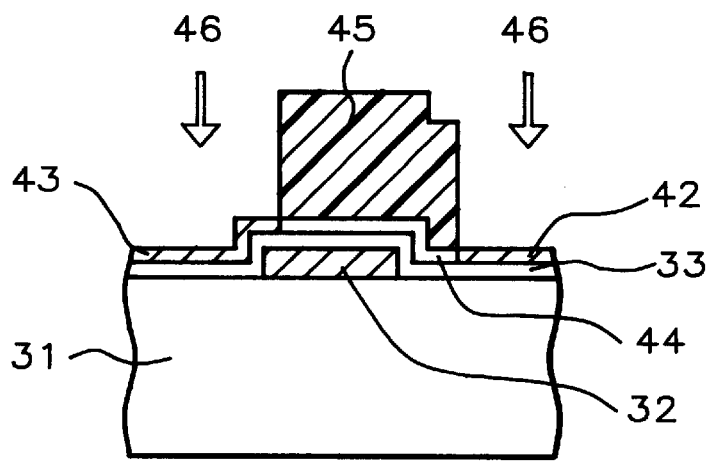

Referring now to FIG. 4, a coating of photoresist is laid down on top of layer 34 and then exposed through a mask so that, after development, photoresist mask 45 results. 45 is similar in shape to poly gate 32 but is given a slight lateral displacement relative to it. Thus, on one side (the left side in FIG. 4) it overlies the poly gate, thus underlapping the edge of the poly gate while on the other side it extends beyond the gate edge so as to overlap the step in the recrystallized poly layer. This arrangement serves to reduce drain leakage in the finished device.

Mask 45 is between about 0.5 and 0.9 microns thick and, during its formation, was exposed to actinic radiation for the normal length of time so that, after development, its width came out to be essentially identical to the width of the optical image that had been projected onto its surface during exposure.

With mask 45 in place, dopant ions (typically boron), symbolized by arrows 46, were implanted into all areas not protected by mask 45. This resulted in the formation of source region 43 and drain region 42, leaving channel region 44 between them.

Figure 5:
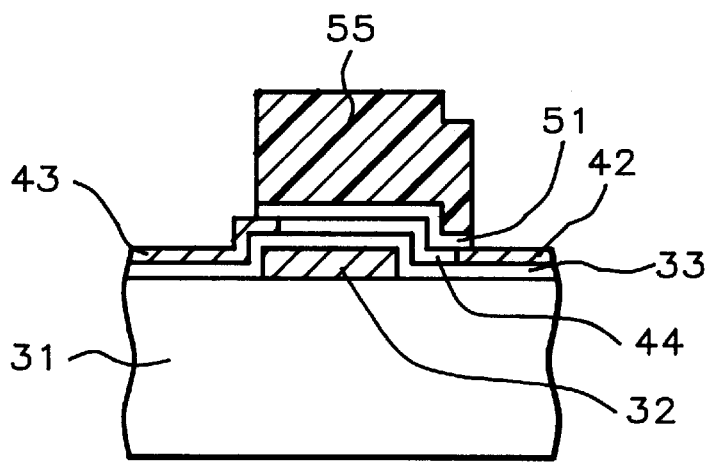

We refer now to FIG. 5. Following the removal of mask 45, a layer of cap oxide, typically about 300 Angstroms thick (although any thickness in the range from about 200 to 500 Angstroms would still be acceptable) is deposited and a fresh coating of photoresist (between about 0.5 and 0.9 microns thick) is laid down and exposed using the same optical mask as used previously to form mask 45. The projected image is aligned, relative to poly gate 32, exactly as before, but this time is given a shorter exposure to the actinic radiation.

After development, this results in photoresist mask 55 which is slightly wider than mask 45 had been (because of the reduced exposure). Consequently, mask 55 overlaps both source region 43 and drain region 42. This slight increase in the size of a slightly underexposed photoresist pattern is a characteristic of the resist. Optimum results were obtained when the integrated exposure energy for the formation of mask 45 was between about 240 and 250 mJ (millijoules) while exposure energy for the formation of mask 55 was between about 290 and 300 mJ. Following the formation of mask 55, the layer of cap oxide was etched, leaving oxide cap 51 in place.

Figure 6:
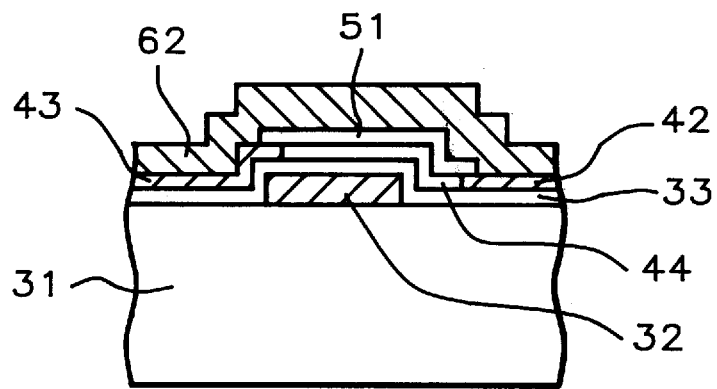

Referring now to FIG. 6, following the removal of photoresist mask 55, layer 62 of a refractory metal such as titanium, cobalt, or tungsten is deposited over the entire structure to a thickness between about 100 and 150 Angstroms. The structure is then subjected to a rapid thermal anneal. This consists of heating at a temperature between about 730 and 760° C. for between about 30 and 60 seconds. The result is silicidation of the refractory metal layer wherever it is in direct contact with silicon. Unreacted metal is then selectively removed by etching in a solution of 2:2:1 ammonium hydroxide, hydrogen peroxide, and water.

Figure 7:
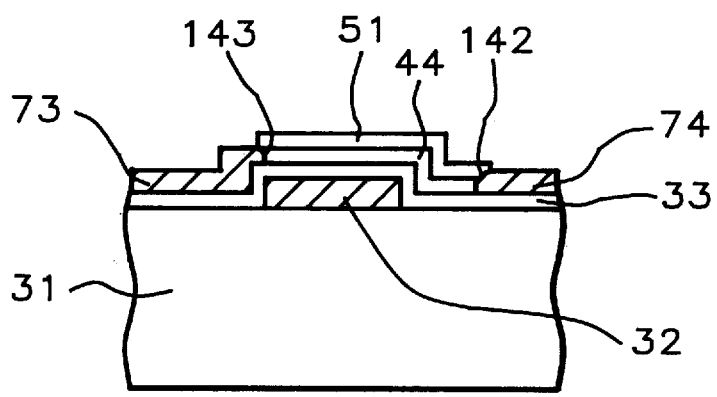

The final result is then the structure seen in FIG. 7. Metal silicide layer 73 is seen to have replaced almost all of source region 43 leaving only a small length 143 of P-doped recrystallized silicon in place and making contact with the source end of channel region 44. Similarly, metal silicide layer 74 is seen to have replaced almost all of drain region 42 leaving only a small length 142 of P-doped recrystallized silicon in place and making contact with the drain end of channel region 44. The silicide being a reasonably good conductor (layers 73 and 74 having a sheet resistance of about 15 ohms/square) the source and drain resistances of the circuit have now been considerably reduced so that a typical value for the source resistance is between about 1,000 and 3,000 ohms while a typical value for the drain resistance is also between about 1,000 and 3,000 ohms. Additionally, the P–N junction in the drain circuit (discussed above) has now been shorted out.

While the invention has been particularly shown and described with reference to the preferred embodiments thereof, it will be understood by those skilled in the art that various changes in form and details may be made without departing from the spirit and scope of the invention.

What is claimed is:

1. A process for manufacturing a thin film transistor, comprising the sequential steps of:

provviding a dielectric substrate;

depositing a layer of polysilicon onto the substrate;

patterning and etching said polysilicon layer to form a poly gate having opposing first and second parallel edges;

depositing a layer of gate oxide over the poly gate and the substrate;

depositing a layer of amorphous silicon over the layer of gate oxide;

recrystallizing the layer of amorphous silicon;

coating said recrystallized layer with a first layer of photoresist;

through an optical mask, exposing said first layer of photoresist to a first quantity of actinic radiation energy and then developing it, thereby forming a first photoresist mask having a first edge, parallel to said first gate edge, that overlies the gate, and a second edge, parallel to said second gate edge, that extends beyond the poly gate;

implanting ions of a dopant species into areas of the recrystallized silicon layer not covered by photoresist whereby a source region is formed in the area abutting the first photoresist edge, a drain region is formed in the area abutting the second photoresist edge, and a channel region is formed between said source and drain regions;

removing the first photoresist mask;

depositing a layer of cap oxide over said layer of recrystallized silicon;

coating said cap oxide layer with a second layer of photoresist;

through the optical mask, exposing said second layer of photoresist to a second quantity of actinic radiation energy that is less than said first quantity of actinic radiation energy, and then developing it, thereby forming a second photoresist mask, having first and second parallel edges, that is wider than the channel region;

removing said layer of cap oxide wherever it is not covered by the second photoresist mask, thereby forming an oxide cap that overlaps the channel region;

depositing a refractory metal layer onto the oxide cap, the source region, and the drain region;

subjecting all layers to a rapid thermal anneal thereby causing silicidation of the refractory metal layer wherever it is in contact with silicon; and selectively removing all refractory metal that has not reacted to form a silicide.

2. The process of claim 1 wherein said layer of polysilicon is deposited to a thickness between about 550 and 1,250 Angstroms.

3. The process of claim 1 wherein said layer of gate oxide is deposited to a thickness between about 200 and 500 Angstroms.

4. The process of claim 1 wherein said layer of amorphous silicon is deposited to a thickness between about 100 and 1,000 Angstroms.

5. The process of claim 1 wherein the step of recrystallizing the layer of amorphous silicon further comprises heating in nitrogen for 22 to 26 hours at a temperature between about 550 and 650° C.

6. The process of claim 1 wherein said first coat of photoresist is between about 0.5 and 0.9 microns thick.

7. The process of claim 1 wherein said first quantity of actinic radiation energy is between about 240 and 250 millijoules.

8. The process of claim 1 wherein said layer of cap oxide is deposited to a thickness between about 200 and 500 Angstroms.

9. The process of claim 1 wherein said second coat of photoresist is between about 0.5 and 0.9 microns thick.

10. The process of claim 1 wherein said second quantity of actinic radiation energy is between about 290 and 300 millijoules.

11. The process of claim 1 wherein the refractory metal is taken from the group consisting of titanium, cobalt, and tungsten.

12. The process of claim 1 wherein the step of subjecting all layers to a rapid thermal anneal further comprises heating for 30 to 60 seconds at a temperature between about 730 and 760 ° C.

* * * * *